(12) United States Patent
Kurtz et al.

(10) Patent No.: US 7,439,159 B2
(45) Date of Patent: Oct. 21, 2008

(54) FUSION BONDING PROCESS AND STRUCTURE FOR FABRICATING SILICON-ON-INSULATOR (SOI) SEMICONDUCTOR DEVICES

(75) Inventors: Anthony D. Kurtz, Saddle River, NJ (US); Alexander A. Ned, Wayne, NJ (US)

(73) Assignee: Kulite Semiconductor Products, Inc., Leonia, NJ (US)

( * ) Notice: Subject to any disclaimer, the term of this patent is extended or adjusted under 35 U.S.C. 154(b) by 453 days.

(21) Appl. No.: 11/262,179

(22) Filed: Oct. 28, 2005

(65) Prior Publication Data

US 2007/0099392 A1    May 3, 2007

(51) Int. Cl.
    *H01L 21/30*    (2006.01)

(52) U.S. Cl. ............... 438/455; 438/542; 257/E21.567

(58) Field of Classification Search ................. 438/455, 438/542; 257/E21.567
See application file for complete search history.

(56) References Cited

U.S. PATENT DOCUMENTS

| 4,498,229 A | 2/1985 | Wilner |
| 4,672,354 A | 6/1987 | Kurtz et al. |
| 5,286,671 A * | 2/1994 | Kurtz et al. ................... 438/50 |
| 6,518,147 B1 * | 2/2003 | Villa et al. .................. 438/429 |

* cited by examiner

*Primary Examiner*—Bradley K Smith
(74) *Attorney, Agent, or Firm*—The Plevy Law Firm

(57) ABSTRACT

A method of fabricating a semiconductor-on-insulator device including: providing a first semiconductor wafer having an about 200 angstrom thick oxide layer thereover; etching the first semiconductor wafer to raise a pattern therein; doping the raised pattern of the first semiconductor wafer through the about 200 angstrom thick oxide layer; providing a second semiconductor wafer having an oxide thereover; and, bonding the first semiconductor wafer oxide to the second semiconductor wafer oxide at an elevated temperature.

13 Claims, 6 Drawing Sheets

FUSION BONDING PROCESS AND STRUCTURE FOR FABRICATING SILICON-ON-INSULATOR (SOI) SEMICONDUCTOR DEVICES

FIELD OF THE INVENTION

The present invention relates generally to semiconductor manufacture techniques and semiconductor devices, and more particularly to silicon-on-insulator (SOI) device manufacture methods and structures.

BACKGROUND OF THE INVENTION

The present invention describes an improved fusion bonding technique for fabricating Silicon-On-Insulator (SOI) devices, such as piezo-resistive devices. Reference is first made to U.S. Pat. No. 5,286,671, entitled "FUSION BONDING TECHNIQUE FOR USE IN FABRICATING SEMICONDUCTOR DEVICES", issued Feb. 15, 1994, to A. D. Kurtz et al., which is assigned to the assignee hereof, Kulite Semiconductor Products, Inc. The entire disclosure of U.S. Pat. No. 5,286,671 is hereby incorporated by reference as if being set forth in its entirety herein.

Therein, P++ implanted regions are bonded to an oxide layer on top of a silicon carrier wafer. The disclosed process is, however, limited in its ability to provide for very fine pattern linewidths, such as those found in piezoresistive patterns. The disclosed process also introduces enough roughness into the finished bonding surface so as to limit the thickness of the dielectric (oxide) layer in the substrate wafer to about 2000 Å-3000 Å. This undesirably limits some performance capabilities of fabricated devices and also results in less than ideal yields and increased wafer processing costs. It is desirable to overcome these limitations.

SUMMARY OF THE INVENTION

A method of fabricating a semiconductor-on-insulator (SOI) device including: providing a first semiconductor wafer having an about 500 angstrom or thinner oxide layer thereover; etching the first semiconductor wafer to raise a pattern therein; doping the raised pattern of the first semiconductor wafer through the about 500 angstrom thick oxide layer; providing a second semiconductor wafer having a thick oxide thereover; and, bonding the first semiconductor wafer oxide to the second semiconductor wafer oxide at an elevated temperature.

BRIEF DESCRIPTION OF THE FIGURES

Understanding of the present invention will be facilitated by considering the following detailed description of the preferred embodiments of the present invention taken in conjunction with the accompanying drawings, in which like numerals refer to like parts, and:

FIGS. 7A and 7B illustrate the pattern wafer of FIGS. 1-5 and the substrate wafer of FIG. 6 at seventh and eighth processing stages, according to aspects of the present invention, respectively; and, FIG. 8 illustrates a silicon-on-insulator (SOI) device according to an aspect of the present invention.

DETAILED DESCRIPTION OF THE PREFERRED EMBODIMENTS

It is to be understood that the figures and descriptions of the present invention have been simplified to illustrate elements that are relevant for a clear understanding of the present invention, while eliminating, for the purpose of clarity, many other elements found in conventional semiconductor device fabrication methods and resulting devices. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein.

According to an aspect of the present invention, a self-aligned, diffusion enhanced, fusion bonding fabrication technique is provided. Such a technique may be particularly well suited for producing optimized, highly accurate, sensor devices.

Figure 1:
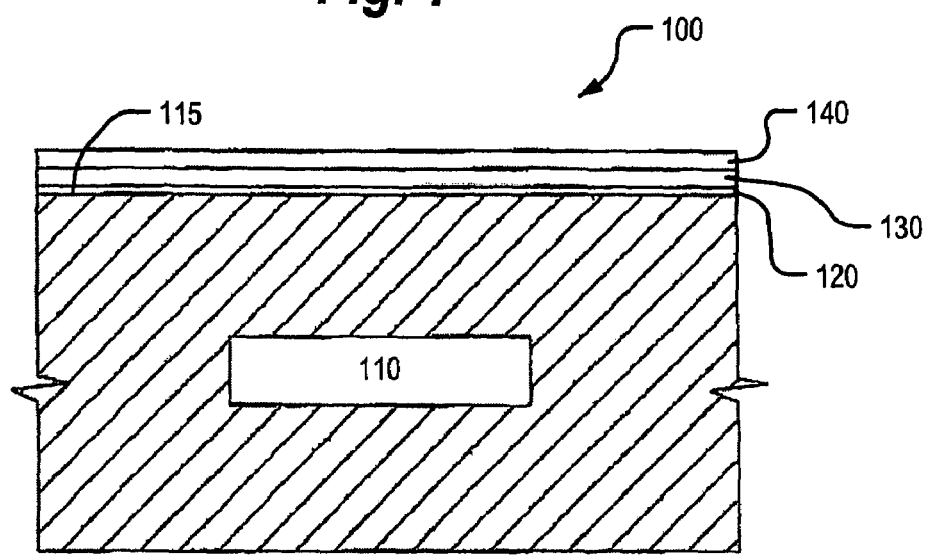
FIG. 1 illustrates a pattern wafer at a first processing stage according to an aspect of the present invention.

Referring now to FIG. 1, there is shown a pattern wafer 100 at a first processing stage according to an aspect of the present invention. Wafer 100 generally includes a silicon substrate 110. Substrate 110 may be composed of N-type silicon, and is preferably a single crystal structure. Substrate 110 may be circular, square or rectangular in the top plan view. Substrate 110 may take the form of a commercially available silicon wafer. Optionally, substrate 110 may be subjected to conventional pre-processing steps, such as cleaning, etching, polishing and/or lapping to a smooth finish.

A thin layer 120 of dry oxide is grown on a surface 115 of substrate 110. Layer 120 is thinner than the corresponding oxide layer presented in the afore-incorporated '671 Patent. Layer 120 may have a thickness on the order of about 500 angstrom (Å) or less. Layer 120 may take the form of an about 200 Å thick layer of $SiO_2$. The growth of oxide layers on silicon substrates is well known in the art. For example, layer 120 may be grown using thermal oxidation of surface 115 of substrate 110. By way of further example, such a thermal oxidation may include heating substrate 110 to a temperature between about 1000° C. and 1300° C., and passing oxygen over surface 115.

A thin nitride layer 130 may be provided over layer 120. Layer 130 is also thinner than the corresponding nitride layer presented in the afore-incorporated '671 Patent. Layer 130 may have a thickness on the order of about 1500 Å or less. Layer 130 may take the form of an about 200 Å-1000 Å thick SiN layer, for example. Layer 130 may be provided using any conventional methodology. For example, a 200-1000 Å thick SiN layer may be deposited upon $SiO_2$ layer 120 using conventional low pressure chemical vapor deposition (LPCVD) techniques.

A quartz layer 140 is provided over nitride layer 130. Quartz layer 140 may be about 1000 Å thick. Layer 140 may be provided using any conventional methodology, such as sputtering.

Figure 2:
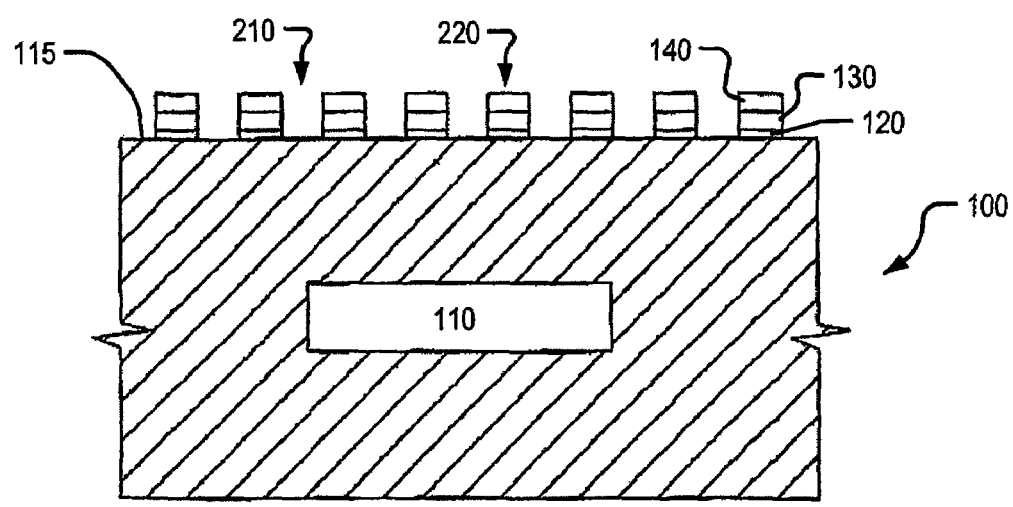
FIG. 2 illustrates the pattern wafer of FIG. 1 at a second processing stage according to an aspect of the present invention.

Referring now also to FIG. 2, there is shown pattern wafer 100 at a second processing stage according to an aspect of the present invention. Therein, layers 140, 130, 120 have been selectively patterned to provide recessed portion 210 and remaining portions 220. Layers 140, 130, 120 may be patterned using conventional methodologies. Due to significant reduction in the layer thickness, this process enables one to define features, e.g., portions 210, 220, with higher precision and resolution than the afore-incorporated '671 Patent. For sake of explanation, references 210, 220 are used throughout the various figures and refer to corresponding portions of the various layers and components.

By way of further example, a layer of positive or negative exposure photoresist (not shown) may be provided over layer 140. This photoresist may be selectively exposed, e.g., ultraviolet (UV) radiation exposed, to define a masking pattern. The masking pattern may be used to selectively remove portions of quartz layer 140. Quartz layer 140 may be selectively etched using a HF based solution, for example. Silicon nitride layer 130 may then be patterned (masked by the patterned quartz layer 140) by a selective etchant that does not attack $SiO_2$, such as phosphoric acid. This produces a series of patterned regions 220 of layer 130 on top of the thin silicon dioxide layer 120. After silicon nitride layer 130 is patterned, the remaining portions 220 of quartz layer 140 may be stripped or etched off using conventional methodology. The remaining portions 220 of silicon nitride layer 130 may be used as a self-aligned mask for selectively etching recesses 210 into silicon dioxide layer 120, using a HF based solution, for example. In fact, substantially all of the oxide layer 120 may be removed, except that which is under the remaining portions 220 silicon nitride layer 130.

Figure 3:
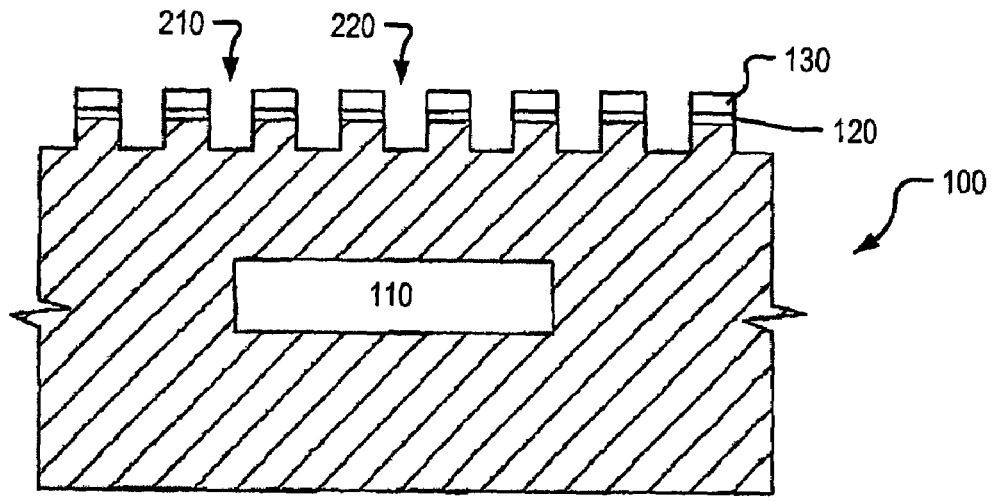
FIG. 3 illustrates the pattern wafer of FIGS. 1 and 2 at a third processing stage according to an aspect of the present invention.

Referring now also to FIG. 3, there is shown pattern wafer 100 at a third processing stage according to an aspect of the present invention. Portions 210 of silicon substrate 110 are etched (using the patterned nitride layer 130 as a mask), to in effect raise portions 220 of silicon substrate 110. The raised portions 220 of substrate 110 correspond to a desired electronics configuration, such as a resistor network useful in a pressure transducer.

Briefly, semiconductor transducers may employ one or more piezoresistive elements which are mounted or diffused in a bridge pattern of resistors on a thin diaphragm member. The diaphragm member, which may be fabricated from silicon, flexes upon application of force thereto and thereby causes stresses on the top surface. These stresses elongate or shorten the piezoresistors and cause them to vary their resistance according to the deflection of the diaphragm. Reference may be had to U.S. Pat. No. 4,498,229 entitled "PIEZORESISTIVE TRANSDUCER", issued on Feb. 12, 1985 to Leslie B. Wilner and to U.S. Pat. No. 4,672,354 entitled "FABRICATION OF DIELECTRICALLY ISOLATED FINE LINE SEMICONDUCTOR TRANSDUCERS AND APPARATUS", issued on Jun. 9, 1987 to Anthony D. Kurtz et al., assigned to the assignee hereof, as illustrative examples of piezoresistive transducer constructions. It is, of course, understood, that many pattern configurations can be accommodated on a silicon substrate 110 though, and that applicability of the present invention is not limited to pressure transducer electronic configurations.

Regardless of the electronics configuration being imparted into silicon substrate 110, silicon nitride layer 130 serves as a mask for pattern etching silicon substrate 110. Portions 210 of substrate 110 may be etched to a depth greater than around 5000 Å below surface 115 of portions 220, for example. A selective etch, such as a potassium hydroxide (KOH) based etchant, may be used to pattern silicon substrate 110 dependently upon the remaining portions 220 of nitride layer 130.

Figure 4:
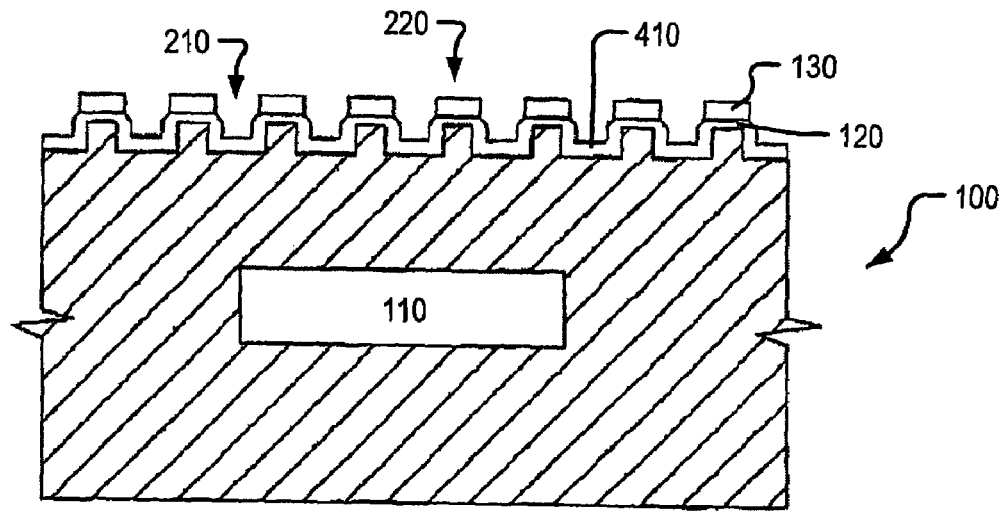
FIG. 4 illustrates the pattern wafer of FIGS. 1, 2 and 3 at a fourth processing stage according to an aspect of the present invention.

Referring now also to FIG. 4, there is shown pattern wafer 100 at a fourth processing stage according to an aspect of the present invention. Analogously to the afore-incorporated '671 Patent, the etched silicon 110 regions 210 are oxidized to provide oxide layer 410. Again, this may be accomplished in any conventional manner, such as thermal oxidation. Oxide layer 410 may, for example, take the form of a $SiO_2$ layer having a thickness of about 5000 Å. Layer 410 may serve to substantially prevent impurities from entering into regions 210 of silicon substrate 110 during subsequent doping processes. In the illustrated embodiment, layer 410 is shown as being contiguous with layer 120. While it is understood that these layers may, or may not, be truly contiguous in practice, such a representation is suitable for purposes of conveying a clear understanding of the present invention.

Figure 5:
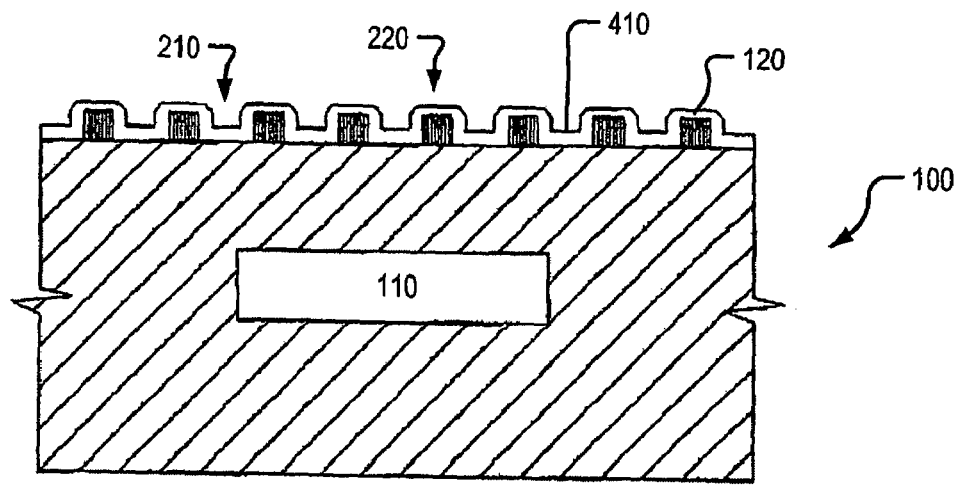
FIG. 5 illustrates the pattern wafer of FIGS. 1, 2, 3 and 4 at a fifth processing stage according to an aspect of the present invention.

Referring now also to FIG. 5, there is shown pattern wafer 100 at a fifth processing stage according to an aspect of the present invention. After oxide layer 410 has been formed, remaining portions 220 of silicon nitride layer 130 may be stripped off. This may be accomplished in any conventional manner. Pattern wafer 110 may then be doped through the well preserved, remaining portion 220 of thin oxide layer 120 by solid state diffusion using a high concentration of Boron to obtain highly doped (degenerate) P++ regions 220. These regions may be used to form the aforementioned resistor network, as well as conductors and electrical contact areas, for example. By utilizing the single, thin oxide layer 120, "degenerate" diffusion can be effected on portions 120 of silicon substrate 110 while preserving the requisite smoothness of the device wafer surface. Analogously to the afore-incorporated '671 Patent, the doping is performed through one underlying silicon dioxide layer 120 in order to preserve the quality of the silicon wafer. However, in the present case, the thinner $SiO_2$ layer 120 provides for improvements in the surface finish of the diffused regions pattern. The pattern wafer 110 may be re-diffused for 3-4 minutes at 1150° C. by degenerate doping the wafer with $B_2H_6$. This second diffusion not only acts as an additional dopant source, but also forms a shallow layer of $B_2O_3$ glass over the device pattern. The presence of the $B_2O_3$ layer also enhances the sealing and improves the overall quality of the bond with the substrate wafer described herein below.

Figure 6:
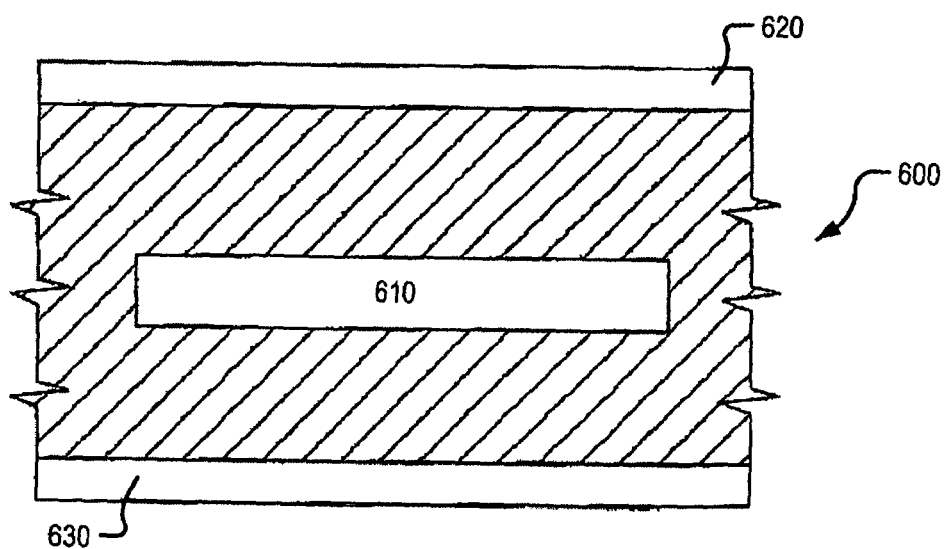
FIG. 6 illustrates a substrate wafer according to an aspect of the present invention.
Figure 7A:
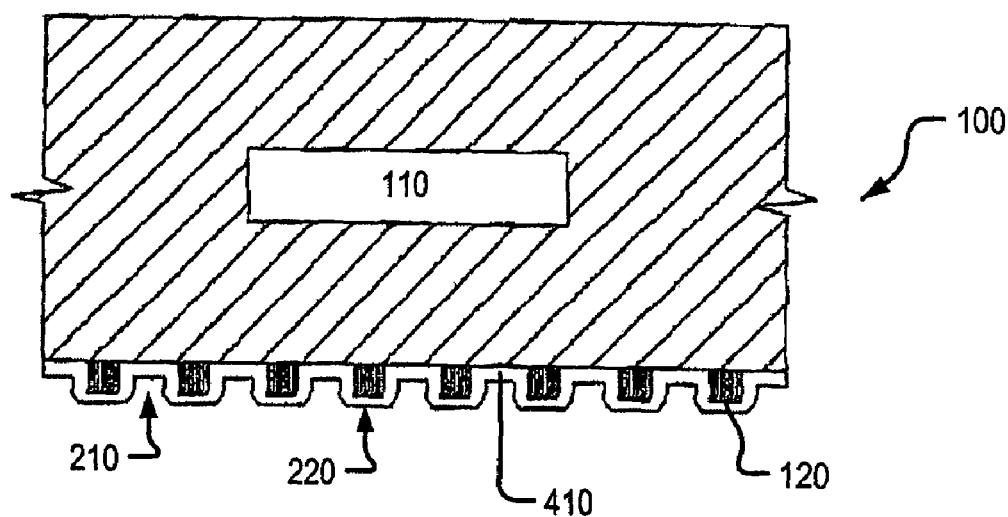
FIG. 7A illustrates the pattern wafer of FIGS. 1-5 and the substrate wafer of FIG. 6 at a sixth processing stage according to an aspect of the present invention.
Figure 7A:
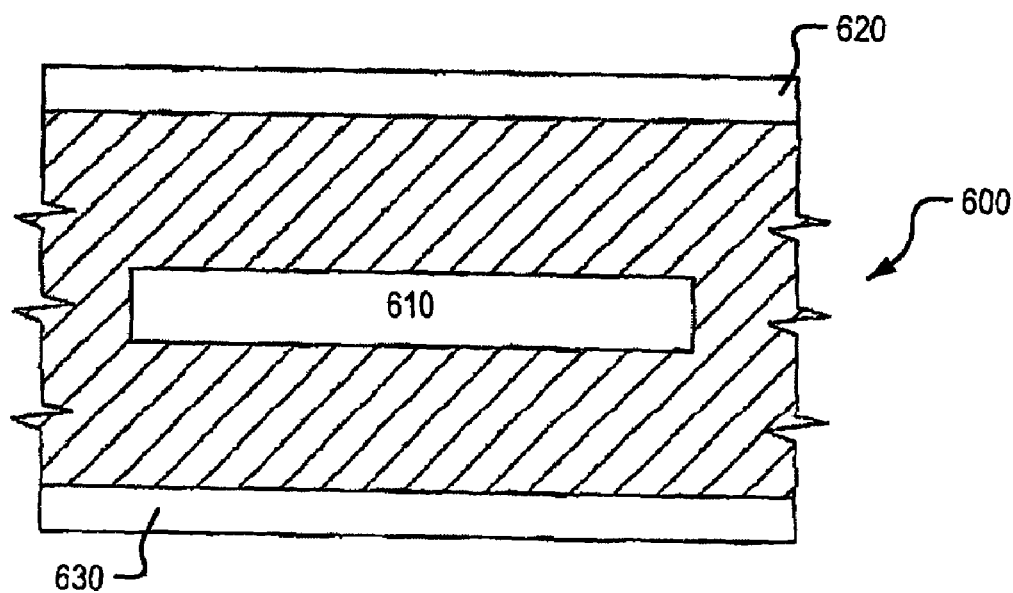
Figure 7B:
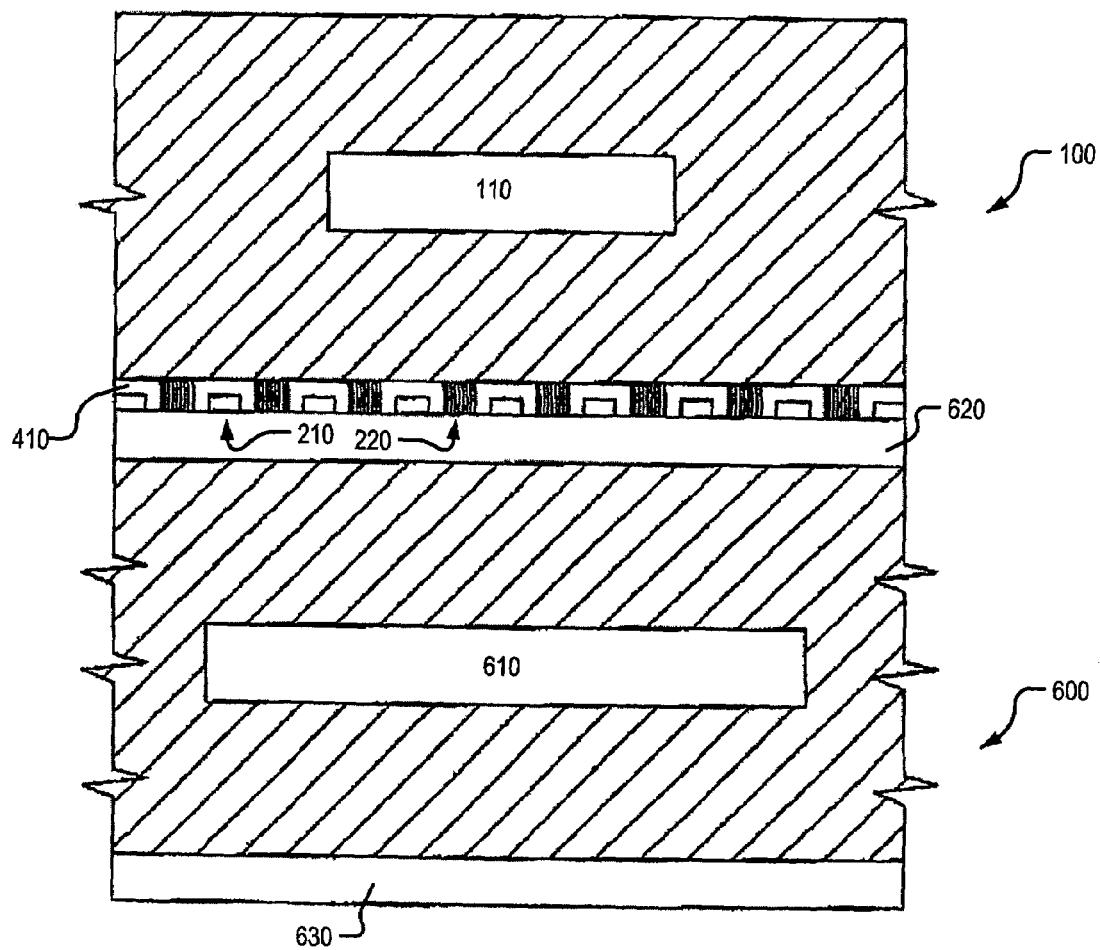

Referring now to FIG. 6, there is shown a substrate wafer 600 according to an aspect of the present invention. A second silicon substrate 610, which may be akin to substrate 110, is oxidized to provide oxide layers 620, 630. One or more of oxide layers 620, 630 may take the form of $SiO_2$, and be on the order of about 5000 Å thick or more. For example, layer 620 may take the form of an about 10,000 Å thick, or thicker, layer of $SiO_2$. Again, layers 620, 630 may be fabricated by thermally oxidizing substrate 610. Optionally, substrate 610 may also be subjected to conventional pre-processing steps, such as cleaning, etching, polishing and/or lapping to a smooth finish. Referring now also to FIG. 7A, there is shown the pattern wafer of FIGS. 1-5 and the substrate wafer of FIG. 6 at a seventh processing stage according to an aspect of the present invention. As may be seen therein, raised portions 220 of wafer 100 may be aligned with oxidized wafer 600. Referring to FIG. 7B, there is shown a (SOI) structure according to an aspect of the present invention. Analogously to the afore-incorporated '671 Patent, wafer 100 is fusion bonded to substrate wafer 600. For example, wafers 100, 600 may be bonded together at around 1000° C. for times on the order of minutes, such as around 5 to 10 minutes.

Figure 8:
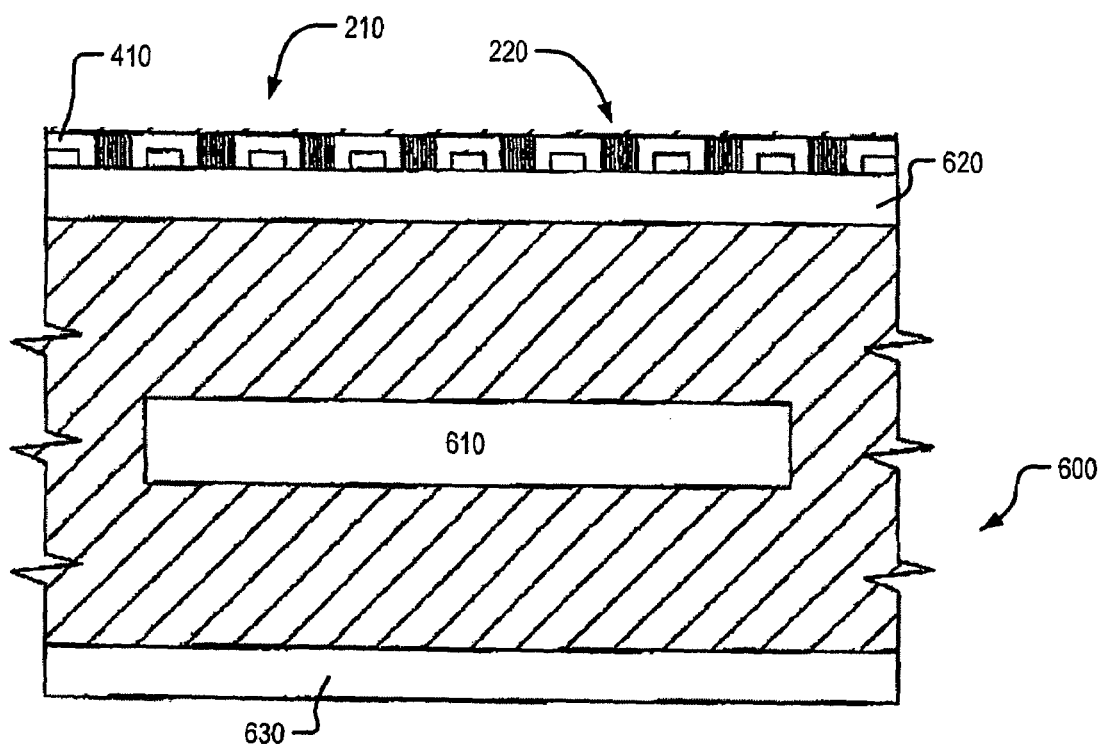

Referring now also to FIG. 8, a conductivity selective etchant may be used to remove the un-, or lightly-doped silicon material from pattern wafer 100 after bonding, thus leaving the highly doped P++ silicon pattern portion 220 bonded to oxide layer 620 on the substrate wafer 610. Other conventional fabrication processing steps may be included.

A major advantage of the present invention is the ability to use the very thin, and even thermally grown, $SiO_2$ layers both for pattern defining and for diffusing through. As will be understood by those possessing an ordinary skill in the pertinent arts, the oxide must be thin enough to diffuse through, but thick enough to prevent the underlying diffused surface from being significantly roughened. In the afore-incorporated '671 Patent, a layer thickness between 1000 Å-2000 Å was used. The present invention provides advantages by using a much thinner layer, that is nonetheless sufficiently thick to prevent surface roughening, thereby allowing for even a higher concentration of P++ silicon to be formed. By increasing the p++ concentration, an even lower temperature dependence of a resulting SOI device may be achieved.

Another unanticipated advantage of the present invention is associated with the ability to accurately define even finer feature sizes (on the order of less than 1 µm), than in the afore-incorporated '671 Patent. This enables one to reduce the overall size of the entire device layout while maintaining, or even improving, the quality of pattern definition. This increases yield and thus decreases the cost per chip, while enabling one to actually add high precision components (i.e., additional resistors, traces, contact regions, etc.) within a smaller overall pattern layout. The improved definition accuracy also significantly reduces pattern-to-pattern variation across an entire wafer, thus leading to significant improvements in the control of the resultant SOI device performance characteristics. This in turn, makes matching of devices, such as sensors, which is sometimes required for particular applications, much easier.

Another unanticipated advantage is associated with the ability to now use significantly thicker oxide films on the substrate wafer for dielectric isolation. The oxide thickness on the substrate wafer was limited to about 2000 Å-3000 Å in the afore-incorporated '671 Patent, due to both the roughness that existed in the doped pattern wafer and in the oxide layer on the substrate wafer. Surface quality (roughness) is one of the main factors contributing to the quality of a fusion bonding process. By significantly improving the surface quality on the pattern wafer, one can assure good fusion bonding, even with substrate oxide thicknesses being on the order of 10,000 Å thick, or more. The ability to provide thick (e.g., 10,000 Å) oxide layers for dielectric isolation carries enormous advantages in terms of device performance characteristics. Mainly, the increase in oxide thickness leads to increases in dielectric strength of the fabricated devices, e.g., sensors, and in fact enables the oxide to withstand device operability up to, and above, 700° C. without exhibiting significant leakage. The increase in oxide thickness also leads to an increase in device capability to withstand significant levels of over-voltage exposure without experiencing any dielectric breakdown, which is typically required in many applications.

Those of ordinary skill in the art may recognize that many modifications and variations of the present invention may be implemented without departing from the spirit or scope of the invention. Thus, it is intended that the present invention covers the modifications and variations of this invention.

What is claimed is:

1. A method of fabricating a semiconductor-on-insulator device comprising:
    providing a first semiconductor wafer having an about 500 or less angstrom thick oxide layer thereover;
    etching said first semiconductor wafer to raise a pattern therein;
    doping said raised pattern of said first semiconductor wafer through said about 500 or less angstrom thick oxide layer;
    providing a second semiconductor wafer having a thick oxide thereover; and,
    bonding said first semiconductor wafer oxide to said second semiconductor wafer oxide at an elevated temperature.

2. The method of claim 1, wherein said first semiconductor wafer has an about 200 angstrom thick oxide layer thereover.

3. The method of claim 1, wherein said oxide layer of said first semiconductor wafer is thermally grown.

4. The method of claim 1, wherein said second semiconductor wafer oxide has a thickness of about 5,000 angstroms or above.

5. The process of claim 1, removing said first semiconductor wafer absent said high conductivity pattern.

6. The process of claim 1, further comprising thermally oxidizing said first semiconductor wafer to provide said about 200 angstrom thick oxide layer.

7. The process of claim 1, further comprising thermally oxidizing said etched portions of said first semiconductor wafer to a thickness greater than about 200 angstroms.

8. The process of claim 7, wherein said thickness of said oxidized etched portions of said second semiconductor wafer is about 10,000 angstroms.

9. The process of claim 1, further comprising providing a nitride over said oxide over said first semiconductor wafer, wherein said etching is dependent upon said nitride.

10. The process of claim 9, wherein said providing said nitride comprises chemical vapor deposition.

11. The process of claim 9, further comprising:
    providing a quartz over said nitride, and, wherein said etching is dependent upon said nitride; and,
    selectively etching said nitride dependently upon said quartz.

12. The process of claim 11, wherein said providing said quartz comprises sputtering.

13. The process of claim 11, further comprising patterning said quartz.

* * * * *